(12) United States Patent
Sakiyama

(10) Patent No.: US 6,956,380 B2
(45) Date of Patent: Oct. 18, 2005

(54) NARROW-BAND AMPLIFIER AND IMPEDANCE-MEASURING APPARATUS

(75) Inventor: Ryoji Sakiyama, Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/817,090

(22) Filed: Apr. 2, 2004

(65) Prior Publication Data

US 2004/0257093 A1 Dec. 23, 2004

(30) Foreign Application Priority Data

Apr. 17, 2003 (JP) .......................................... 2003-112671

(51) Int. Cl.[7] .......................... G01R 27/02; G01R 27/28
(52) U.S. Cl. ....................................... 324/610; 324/650
(58) Field of Search .......................... 327/100; 600/399, 600/400, 442, 506, 547; 324/158.1, 610, 609, 602, 600, 525, 123 C, 135, 139, 436, 442, 236, 239, 649, 650, 691, 713; 702/65, 198, 107, 117, 189–191; 379/30, 377, 394, 398; 73/335.03

(56) References Cited

U.S. PATENT DOCUMENTS

| | | | | |
|---|---|---|---|---|
| 4,870,341 A | * | 9/1989 | Pihl et al. .................... 324/600 |
| 5,382,956 A | * | 1/1995 | Baumgartner et al. ...... 341/155 |
| 5,532,590 A | * | 7/1996 | Yamanaka .................... 324/239 |
| 6,208,134 B1 | * | 3/2001 | Demma .................. 324/207.26 |
| 6,525,522 B1 | * | 2/2003 | Pickerd .................... 324/76.58 |
| 2004/0189326 A1 | * | 9/2004 | Chikamatsu ................. 324/650 |
| 2004/0212374 A1 | * | 10/2004 | Iwasaki ....................... 324/650 |

FOREIGN PATENT DOCUMENTS

JP 10-038936 2/1998

* cited by examiner

*Primary Examiner*—Anjan Deb
*Assistant Examiner*—Hoai-An D. Nguyen

(57) ABSTRACT

An impedance measuring apparatus comprising an automatic balanced bridge has four numerically controlled oscillators that supply sine-wave signals and cosine-wave signals to the quadrature detector and vector modulator of the narrow-band amplifier inside the automatic balanced bridge. The frequency or phase of the output signals of the four numerically controlled oscillators are updated by numeric control from the outside. The four numerically controlled oscillators of the impedance measuring apparatus are oscillators whose frequency or phase is changed a predetermined time after they have been controlled from the outside. Furthermore, the impedance measuring apparatus has control means with which the change in the frequency or the phase of the output signals of the four numerically controlled oscillators is synchronized.

9 Claims, 5 Drawing Sheets

NARROW-BAND AMPLIFIER AND IMPEDANCE-MEASURING APPARATUS

BACKGROUND OF THE INVENTION

1. Field of the Invention

The present invention pertains to an impedance measuring apparatus, and in particular relates to an impedance measuring apparatus with which high-speed measurement is possible.

2. Discussion of the Background Art

Impedance measuring apparatuses that operate by the automatic balanced bridge method are an example of the prior art of impedance measuring apparatuses. Impedance measuring apparatuses that operate by the automatic balanced bridge method are characterized in that they cover a broad measurement frequency range and their measurement accuracy is good within a broad impedance measurement range.

The internal structure and operation of an impedance measuring apparatus that operates by the automatic balanced bridge method are described below. FIG. 1 is a drawing showing the internal structure of an impedance measuring apparatus that operates by the automatic balanced bridge method. The impedance measuring apparatus 10 in FIG. 1 comprises a signal source 200, a current-to-voltage converter 300, and a vector voltmeter 400 for determining the impedance of a device under test 100. The entire impedance measuring apparatus 10 is operated under the control of an operation control device $CTRL_1$ (not illustrated), such as a CPU.

The device under test 100 is an element or a circuit having two terminals. Device under test 100 should have at least two terminals and therefore, it can be an element or a circuit with three or more terminals. In this case, two of the three or more terminals are used for the measurements. Device under test 100 is represented by "DUT"in FIG. 1. The point where device under test 100 is connected to a cable 510 and a cable 520 in FIG. 1 is referred to as the High terminal. Moreover, the point where device under test 100 is connected to a cable 530 and a cable 540 is referred to as the Low terminal.

The signal source 200 is the signal source that is connected to the first terminal of device under test 100 by cable 510 and generates measurement signals that are fed to device under test 100. Moreover, signal source 200 is also connected to vector voltmeter 400 by cable 510, cable 520, and a buffer 550 and feeds the measurement signals to vector voltmeter 400. The measurement signals are single sine-wave signals.

The current-to-voltage converter 300 converts the current that flows to device under test 100 and outputs the voltage signals to a buffer 560. Current-to-voltage converter 300 comprises a zero-phase detector 310, a narrow-band amplifier 600, a buffer 320, and a range resistor 330. Cable 530, zero-phase detector 310, narrow-band amplifier 600, buffer 320, range resistor 330, and cable 540 form a negative feedback loop 340.

The zero-phase detector 310 balances the current that flows to range resistor 330 and the current that flows to device under test 100 and outputs signals to narrow-band amplifier 600 such that the current that flows into the input terminals of zero-phase detector 310 through cable 530 will be brought to zero. When the current that flows to range resistor 330 and the current that flows to device under test 100 are balanced, the current at the Low terminal is kept at virtual ground.

Refer to FIG. 2. FIG. 2 is a drawing showing the internal structure of the narrow-band amplifier 600. Narrow-band amplifier 600 comprises a quadrature detector 610, a filter 620, a filter 630, and a vector modulator 640, and amplifiers, and amplifies the output signals of zero-phase detector 310 and outputs them to buffer 320. Narrow-band amplifier 600 resolves the output signals of zero-phase detector 310 into an in-phase component and an quadrature-phase component using phase detector 610, filters the in-phase component and quadrature-phase component by means of filters 620 and 630, modulates the filtered in-phase component and quadrature-phase component by means of vector modulator 640, and feeds the vector-modulated voltage signals to buffer 320.

The signal source 650 is a sine-wave signal source having the same frequency as the measurement signals. The output signals of signal source 650 are converted to cosine-wave signals by a phase-shift circuit 660. Moreover, a phase-tracking circuit 670 outputs the output signals of signal source 650 staggered by a pre-determined phase. A phase-tracking circuit 680 outputs the output signals of phase-shift circuit 660 staggered by a pre-determined phase.

The quadrature detector 610 comprises mixers 611 and 612. The output signals of phase-tracking circuit 670 are input to mixer 611. The output signals of phase-tracking circuit 680 are input to mixer 612. The sine-wave signals output by phase-tracking circuit 670 and the cosine-wave signals output by phase-tracking circuit 680 have the same frequency as the measurement signals and they are orthogonal to each other. Consequently, mixers 611 and 612 can orthogonally resolve the output signal of zero-phase detector 310 into an in-phase component and an quadrature-phase component.

The filter 620 is an integrator that comprises a resistor and that integrates the output signals of mixer 611. The filter 630 is an integrator that integrates the output signals of mixer 612.

The vector modulator 640 comprises mixers 641 and 642, and an adder 643. The output signals of signal source 650 are input to mixer 641. The output signals of phase-shift circuit 660 are input to mixer 642. The sine-wave signals output by signal source 650 and the cosine-wave signals output by phase-shift circuit 660 have the same frequency as the measurement signals, and they are orthogonal to each other. Mixer 641 modulates the output signals of filter 620 with the sine-wave signals that are output from signal source 650 and outputs these signals. Mixer 642 modulates the output signals of filter 630 with the cosine-wave signals output from phase-shift circuit 660 and outputs these signals. The voltage signals output from mixer 641 and the voltage signals output from mixer 642 are added by adder 643 and output to buffer 320.

As is also made clear from the above-mentioned description, the band that is temporarily amplified by narrow-band amplifier 600 is narrow but can correspond to a broad frequency range because the frequency of the output signals of signal source 650 are variable.

Refer to FIG. 1 again. Vector voltmeter 400 measures the output signal $E_{dut}$ of buffer 550 and the output signal $E_{rr}$ of buffer 560. Control device $CTRL_1$ calculates the vector ratio between signal $E_{dut}$ and signal $E_{rr}$ that have been measured and further, calculates the impedance of device under test 100 from the calculated vector ratio and the resistance of range resistor 330.

Measurement of the gate oxide film thickness is one important measurement in the production of MOS devices formed on a semiconductor wafer. The gate oxide film thickness is an important parameter in determining the operating threshold of MOS-type devices. The gate oxide film thickness is measured by measuring the impedance of an MOS device, calculating the capacitance from the impedance measurement, and converting this calculated capacitance to the equivalent oxide film thickness using the dielectric constant. There are two problems with measuring the impedance of an MOS device with conventional impedance measuring apparatus 10.

The first problem is that when the frequency of the output signals of signal source 650 change, it takes time until the signals that are input to mixer 611 and the like stabilize. The frequency of the output signals of signal source 650 change in accordance with the measurement signals when the impedance of device under test 100 is measured at multiple frequencies. As previously mentioned, the output signals of signal source 650 are input to mixer 611 and the like through phase-shift circuit 660, phase-tracking circuit 670, or phase-tracking circuit 680. Conventional phase-shift circuit 660 comprises a PLL circuit. Moreover, phase-tracking circuits 670 and 680 comprise a all-pass filter or a high-passfilter. Consequently, when the frequency of the signals that are input change, it takes time until the output signals of phase-shift circuit 660, phase-tracking circuit 670, and phase-tracking circuit 680 stabilize. An impedance measuring apparatus measures the impedance while shifting to several frequencies. In this case, if the signal convergence time is prolonged, the convergence time of the output signals of current-voltage converter 300 will also be prolonged, delaying the start of measurement. In the end, the above-mentioned signal convergence time becomes a detrimental factor to high-speed measurement.

The second problem is the trade-off between measurement precision and circuit size. Impedance measuring apparatus 10 is adjusted to a open-loop phase shift of negative feedback loop 340 of 180° for stable operation of this negative feedback loop 340. Specifically, operation control device $CTRL_1$ controls phase-tracking circuit 670 and adjusts the phase difference between the signals input to mixer 611 and the signals input to mixer 641. Moreover, operation control device $CTRL_1$ controls phase-tracking circuit 680 and adjusts the phase difference between the signals input to mixer 611 and the signals input to mixer 641. Conventional phase-tracking converters 670 and 680 comprise circuits with passive components, such as resistors and capacitors. If phase-tracking circuits 670 and 680 are to precisely adjust the above-mentioned phase difference, they must have many combinations of resistors and capacitors. The increase in the number of components leads to an increase in the circuit size and a decrease in the mean-time-before-failure (MTBF). Moreover, resistors and capacitors are dependent on temperature, and an increase in the number of components invites an increase in measurement errors. On the other hand, when there is a reduced number of resistors and capacitors, the convergence time of negative feedback loop 340 is increased. In particular, when the impedance of an MOS device formed on a wafer is measured, it is measured through a switch matrix and probe cards, and the like, and therefore, the problem of convergence time becomes obvious. In addition, there are cases in which the phase shifts of phase-tracking circuits 670 and 680 are not the same and measurement error is generated.

There has been considerable progress in microfabrication technology for semiconductors in recent years, with a huge number of elements or circuits being formed on one wafer. While there has been an obvious increase in the number of elements that serve as the device under test, a corresponding increase in measurement time is not allowed. Moreover, the sacrifice of measurement precision for high-speed measurement is not acceptable. The realization of high-speed, high-precision impedance measurement is a very important problem in the semiconductor industry today.

SUMMARY OF THE INVENTION

An apparatus with which the impedance can be measured at high speed and high precision in order to solve the above-mentioned problems.

The first embodiment of the present invention is characterized in that a narrow-band amplifier, which is a narrow-band amplifier comprising a quadrature detector, integrators, and a vector modulator, with this narrow-band amplifier resolving input signals into in-phase components and quadrature-phase components by means of this quadrature detector, integrating these in-phase components and these quadrature-phase components by means of these respective integrators, vector-modulating these integrated in-phase components and these integrated quadrature-phase components by means of this vector modulator, and outputting vector signals; further comprises first, second, third, and fourth signal. sources, and control means, wherein this first signal source feeds first sine-wave signals to this quadrature detector, this second signal source feeds first cosine-wave signals orthogonal with the first sine-wave signals to this quadrature detector, this third signal source feeds second sine-wave signals to this vector modulator, this fourth signal source feeds second cosine-wave signals orthogonal with the second sine-wave signals to this vector modulator; this first, second, third, and fourth signal sources are signal sources that numerically control the output signal frequency and phase by means of this control means, with the output signals being updated once a pre-determined wait time has passed after control by this control means, and this control means controls these first, second, third and fourth signal sources before the time when they are about to be synchronized by the pre-determined wait time so that the times when the output signals of these first, second, third, and fourth signal sources change are all synchronized.

The signals that are supplied to this quadrature detector and this vector modulator are controlled so that a state in which the output signals of these integrators are stable is maintained.

The phase difference between these first sine-wave signals and these second sine-wave signals is adjusted by controlling this first signal source and the phase difference between these first cosine signals and these second cosine signals is adjusted by controlling this first signal source.

The apparatus according to the present invention can also comprise a clock source, wherein this clock source feeds clock signals to the first, second, third, and fourth signal sources, and the pre-determined wait time is determined by the period of these clock signals.

An impedance measuring apparatus, characterized in that an impedance measuring apparatus, which is an impedance measuring apparatus that comprises a signal source connected to the first terminal of a device under test, a feedback amplifier that is connected to the second terminal of this device under test to keep this second terminal at virtual ground, and converts current signals that flow to this device under test to voltage signals and outputs these voltage signals, and means for determining the vector voltage ratio of the voltage signals between these first and second terminals and the output signals of this feedback amplifier, and that measures the impedance of this device under test from this vector voltage ratio, with the feedback amplifier comprising a narrow-band amplifier and this narrow-band amplifier comprising a quadrature detector, integrators, and vector modulator and resolving input signals into in-phase components and quadrature-phase components by means of this quadrature detector, integrating these in-phase components and these quadrature-phase components by means of these respective integrators, vector-modulating these integrated in-phase components and these integrated quadrature-phase components by means of this vector modulator, and outputting vector signals; further comprises first, second, third and fourth signal sources and control means; this first signal source feeds first sine-wave signals to this quadrature detector; this second signal source feeds first cosine-wave signals orthogonal with the first sine-wave signals to this quadrature detector; this third signal source feeds second sine-wave signals to this vector modulator; this fourth signal source feeds second cosine-wave signals orthogonal with the second sine-wave signals to this vector modulator; these first, second, third, and fourth signal sources are signal sources that numerically control the output signal frequency and phase by means of this control means, with the output signals being updated once their respective pre-determined wait time has lapsed after control by this control means, and this control means controls these first, second, third and fourth signal sources before the time when they are about to be synchronized by this pre-determined wait times so that the times when the output signals of these first, second, third, and fourth signal sources are changed are all synchronized.

The signals that are supplied to this quadrature detector and the vector modulator are controlled so that a state in which the output signals of these integrators are stable is maintained.

The phase difference between these first sine-wave signals and these second sine-wave signals is adjusted by controlling this first signal source and the phase difference between these first cosine-wave signals and these second cosine-wave signals is adjusted by controlling this second signal source.

The impedance measuring device may further comprise a clock source, and this clock source feeds clock signals to the first, second, third, and fourth signal sources, and the pre-determined wait time is determined by the period of the clock signals.

An impedance measuring apparatus, which is an impedance measuring apparatus that comprises a signal source connected to a first terminal of a device under test, a feedback amplifier that is connected to the second terminal of this device under test to keep this second terminal at virtual ground, and that converts current signals that flow to this device under test to voltage signals and outputs these voltage signals, and means for determining the vector voltage ratio of the voltage signals between these first and second terminals and the output signals of this feedback amplifier, and that measures the impedance of this device under test from this vector voltage ratio, with this feedback amplifier comprising a modulation-type narrow-band amplifier comprising a quadrature detector and a vector modulator; further comprises first, second, third and fourth signal sources and a control means, wherein this first signal source feeds first sine-wave signals to said quadrature detector; this second signal source feeds first cosine-wave signals orthogonal with the first sine-wave signals to this quadrature detector, this third signal source feeds second sine-wave signals to this vector modulator; this fourth signal source feeds second cosine-wave signals orthogonal with the second sine-wave signals to this vector modulator; this first, second, third, and fourth signal sources are signal sources whose output signal frequency and phase are numerically controlled by means of this control means, and this control means adjusts the phase difference between these first sine-wave signals and these second sine-wave signals by controlling this first signal source and adjusts the phase difference between these first cosine-wave signals and these second cosine-wave signals by controlling this second signal source.

DETAILED DESCRIPTION OF THE PREFERRED EMBODIMENTS

Figure 1:
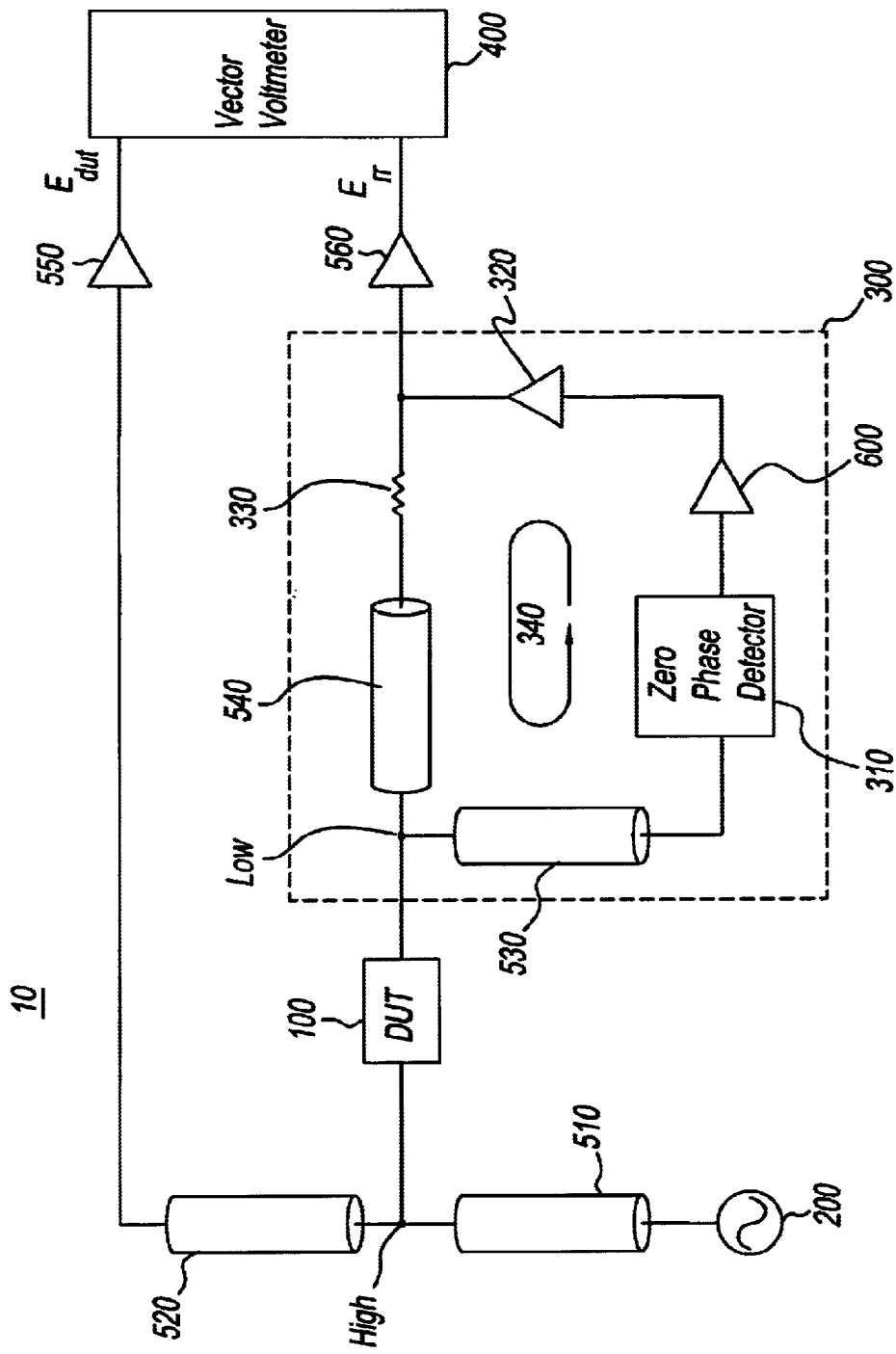
FIG. 1 is a drawing showing the internal structure of an impedance measuring apparatus of the prior art.
Figure 2:
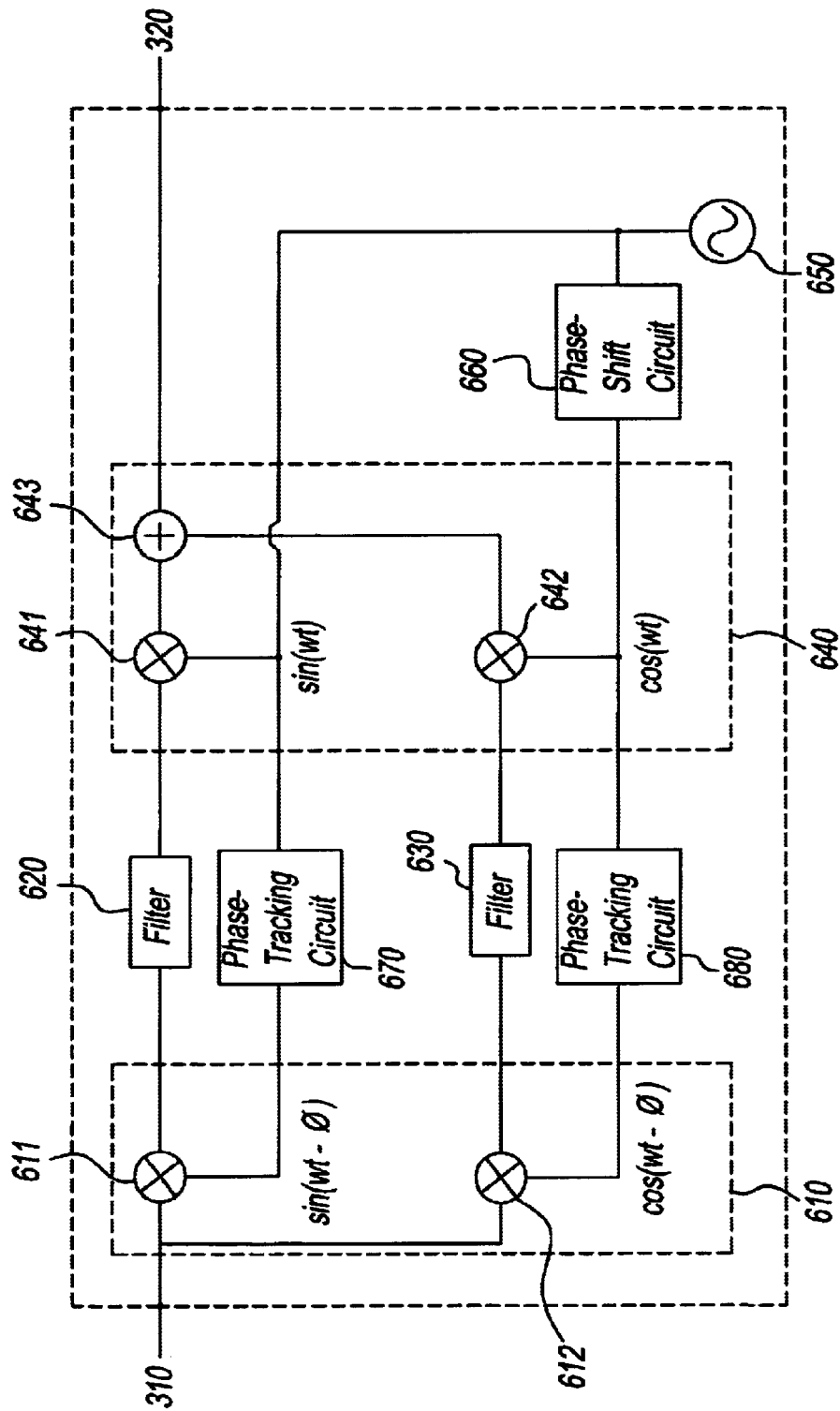
FIG. 2 is a drawing showing the internal structure of a narrow-band amplifier installed in an impedance measuring apparatus of the prior art.
Figure 3:
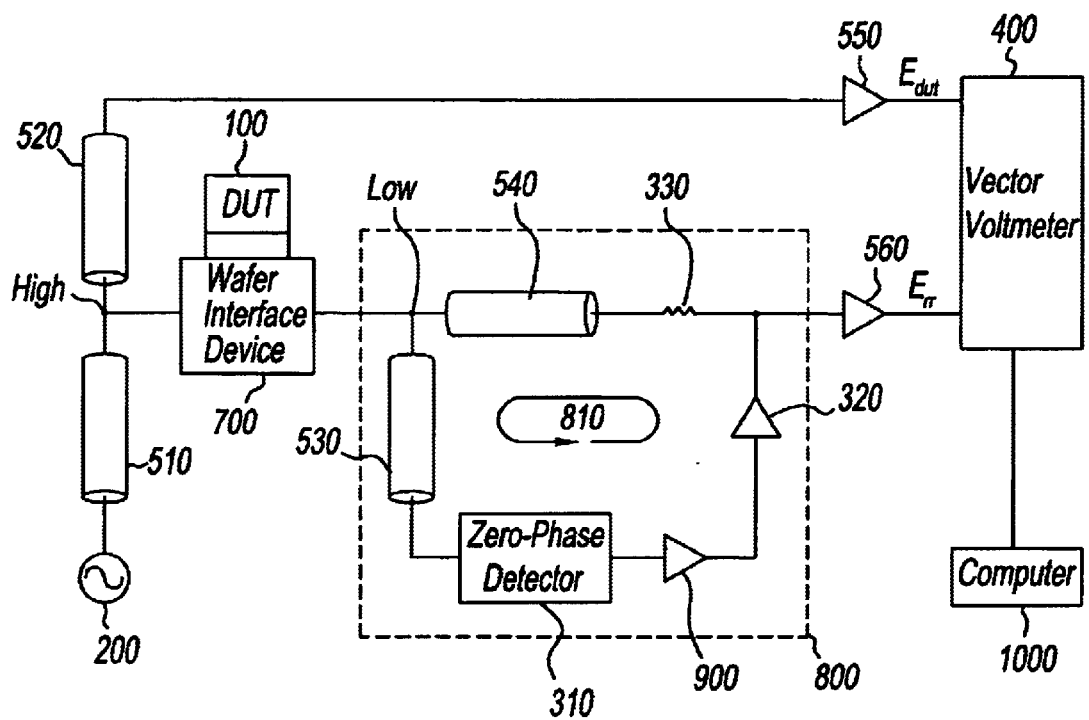
FIG. 3 is a drawing showing the internal structure of an impedance measuring apparatus of the present invention.

The present invention will now be described based on the preferred embodiment shown in the appended drawings. The preferred embodiment of the present invention is an impedance measuring apparatus that operates by the automatic balanced bridge method, and its internal structure is shown in FIG. 3. The same reference symbols are used for structural elements having the equivalent function and properties in FIGS. 1 and 3.

The impedance measuring apparatus 20 in FIG. 3 comprises a signal source 200, a current-to-voltage converter 800, and a vector voltmeter 400 for measuring the impedance of a device under test 100. Impedance measuring apparatus 20 operates under the control of a computer device 1000 that executes the programs.

The device under test 100 represents multiple MOS devices on a semiconductor wafer. For convenience, device under test 100 is represented in the drawing as only one "DUT." The MOS capacity of the MOS device is measured in the present embodiment and therefore, device under test 100 is a capacitor with a first terminal and a second terminal. Device under test 100 is connected to impedance measuring apparatus 20 through a wafer interface device 700. Although not illustrated, wafer interface device 700 comprises a chuck for anchoring the semiconductor wafer, a probe card, a switch matrix, and the like. The point where wafer interface device 700 is connected to a cable 510 and a cable 520 is referred to as the High terminal. Moreover, the point where wafer interface device 700 is connected to a cable 530 and a cable 540 is referred to as the Low terminal. Device under test 100 should have at least two terminals and therefore, can be an element or circuit with three or more terminals, such as a transistor. In this case, two of the three or more terminals are used in the measurements.

The signal source 200 is the signal source that is connected to the first terminal of device under test 100 via cable 510 and wafer interface device 700 and generates the measurement signals that will be fed to device under test 100. Moreover, signal source 200 is the signal source that is connected to vector voltmeter 400 through cable 510, cable 520, and buffer 550 and feeds measurement signals to vector voltmeter 400. The measurement signals are single sine-wave signals. However, the measurement signals are not limited to single sine-wave signals and can also be signals that comprise multiple sine waves.

The current-to-voltage converter 800 converts current flowing to device under test 100 and outputs voltage signals to a buffer 560. Current-to-voltage converter 800 comprises a zero-phase detector 310, a narrow-band amplifier 900, a buffer 320, and a range resistor 330. Cable 530, zero-phase detector 310, narrow-band amplifier 900, buffer 320, range resistor 330, and cable 540 form a negative feedback loop 810.

The zero-phase detector 310 balances the current that flows to range resistor 330 and the current that flows to device under test 100 and outputs signals to narrow-band amplifier 900 so that the current that flows through cable 530 to the input terminal of zero-phase detector 310 is brought to zero. When the current that flows to range resistor 330 and the current that flows to device under test 100 are balanced, the voltage of the Low terminal is kept at virtual ground.

Figure 4:
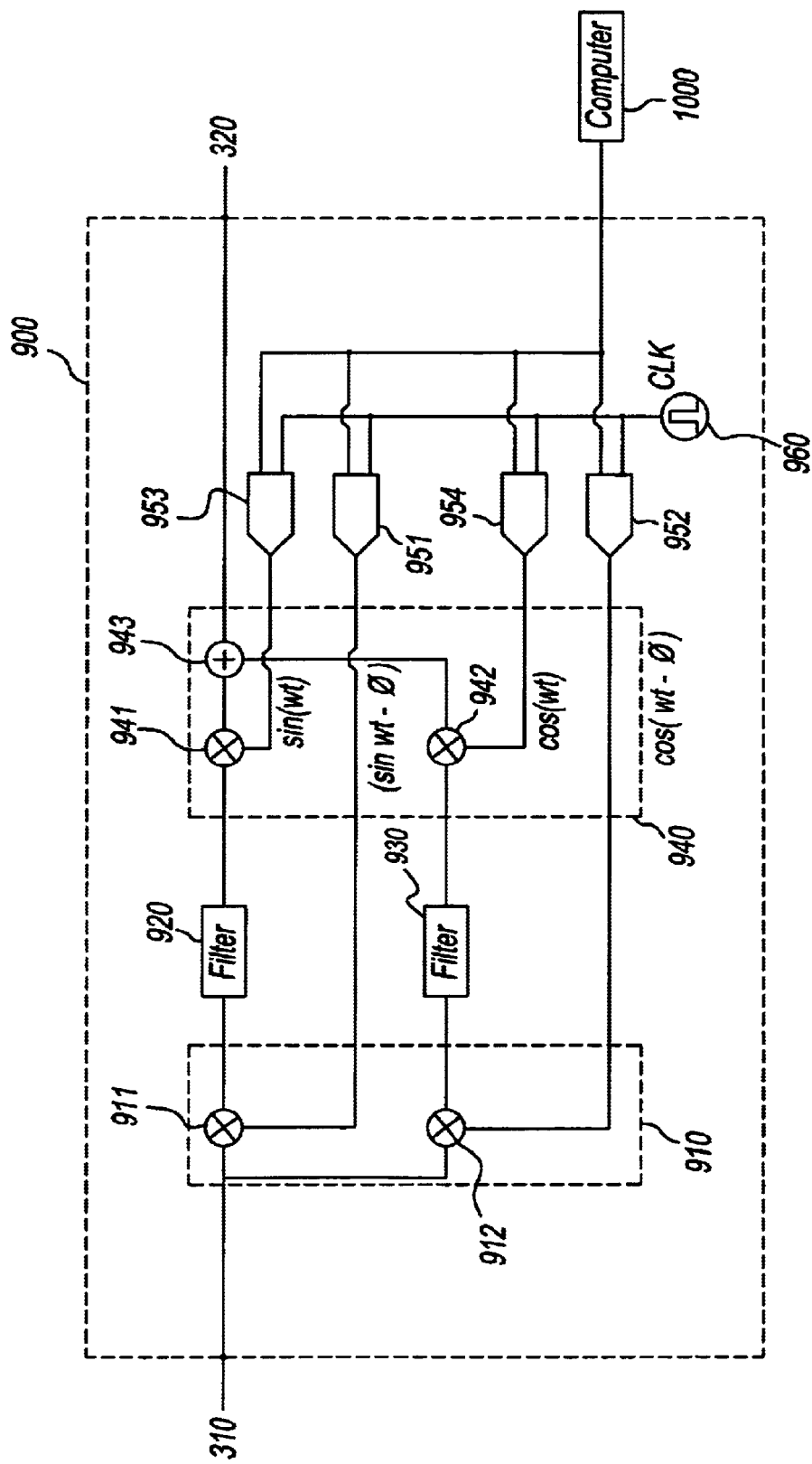
FIG. 4 is a drawing showing the internal structure of a narrow-band amplifier installed in an impedance measuring apparatus of the present invention.

Refer to FIG. 4. FIG. 4 is a drawing showing the internal structure of narrow-band amplifier 900. Narrow-band amplifier 900 comprises a quadrature detector 910, filters 920 and 930, and a vector modulator 940, and amplifies the output signals of zero-phase detector 310 and outputs them to buffer 320. Narrow-band amplifier 900 also comprises a clock source 960 and signal sources 951, 952, 953, and 954.

The clock source 960 feeds clock signals CLK to signal sources 951, 952, 953, and 954. Clock signals CLK generated by the clock source are rectangular-wave signals. As long as the clock signals CLK generated by the clock source can actuate signal source 951, etc., they are not limited to rectangular-wave signals and can be, for instance, sine-wave signals. The clock signal lines that connect each of signal sources 951, 952, 953, and 954 with clock source 960 are designed so that the length of the electric circuit and the impedance are equal in order to synchronize and transmit clock signals CLK. Moreover, it is preferred that clock source 960 and signal sources 951, 952, 953, and 954 be designed so that the clock signal lines that connect these sources and the impedance match in order to synchronize and transmit clock signals CLK. Furthermore, it is preferred that the clock signals CLK be waveform-shaped at the receiving end by a Schmitt trigger circuit and the like. The synchronizing effect of these technologies becomes more obvious with an increase in the frequency of clock signals CLK.

The signal sources 951 and 953 output sine-wave signals in response to clock signals CLK. Moreover, signal sources 952 and 954 are signal sources that output cosine-wave signals in response to clock signals CLK. Signal sources 951, 952, 953, and 954 represent the same direct digital synthesizer and the frequency and phase of the signals that are output are individually controlled by computer 1000. The frequency and phase of the output signals of signal sources 951, 952, 953, and 954 may be updated after a pre-determined wait time after being controlled by computer 1000. The output signals of signal sources 951, 952, 953, and 954 have the same frequency as the measurement signals. Moreover, the output signals of signal source 951 and the output signals of signal source 952, as well as the output signals of signal source 953 and the output signals of signal source 954, are orthogonal to one another. It should be noted that signal sources 951 and 953 can output cosine-wave signals and signal sources 952 and 954 can output sine-wave signals. The output signals of signal sources 951, 952, 953, and 954 are not limited to sine-wave signals or cosine-wave signals and can be, for instance, rectangular-wave signals. Furthermore, signal sources 951, 952, 953, and 954 can be numerically controlled oscillators capable of being digitally controlled by computer 1000.

The quadrature detector 910 comprises mixers 911 and mixer 912. The output signals of signal source 951 are input to mixer 911. Moreover, the output signals of signal source 952 are input to mixer 912. The output signals of signal source 951 and the output signals of signal source 952 have the same frequency as the measurement signals and the signals are orthogonal to each other. Consequently, mixer 911 and mixer 912 orthogonally resolve the output signals of zero-phase detector 310 into in-phase components and quadrature-phase components and output the signals to filters 920 and 930.

Filter 920 is an integrator, and integrates the output signals of mixer 911. Moreover, filter 930 is an integrator, and integrates the output signals of mixer 912.

The vector modulator 940 comprises mixers 941 and 942, and an adder 943. The output signals of signal source 953 are input to mixer 941. The output signals of signal source 954 are input to mixer 942. The output signals of signal source 953 and the output signals of signal source 954 have the same frequency as the measurement signals, and they are orthogonal to each other. Mixer 941 modulates the output signals of filter 920 with the signals that are output from signal source 953 and outputs these signals. Mixer 942 modulates the output signals of filter 930 with the signals output from signal source 954 and outputs these signals. The signals output from mixer 941 and the signals output from mixer 942 are added by adder 943 and output to buffer 320.

Refer to FIG. 3. Vector voltmeter 400 measures the output signal $E_{dut}$ of buffer 550 and the output signal $E_{rr}$ of buffer 560. Computer 1000 calculates the vector ratio of the measured signal $E_{dut}$ and the signal $E_{rr}$ and further, calculates the impedance of device under test 100 from the calculated vector ratio and the resistance of range resistor 330. Although not illustrated, range resistor 330 comprises multiple resistors with different resistances and selects the resistor as needed in accordance with the impedance of device under test 100 that is to be measured. Impedance measuring apparatus 20 thereby can measure impedance from a wide range of values.

When the impedance of device under test 100 is measured at multiple frequencies, impedance measuring apparatus 20 changes the frequency of the output signals of signal sources 200, 951, 952, 953, and 954. When the frequency of the output signals of signal sources 951, 952, 953, and 954 is changed, computer 1000 controls signal sources 951, 952, 953, and 954 just before when the output signals are to be output by their respective pre-determined wait time so that the times when the respective output signals of signal sources 951, 952, 953, and 954 change are all synchronized.

In addition, signal sources 951, 952, 953, and 954 of impedance measuring apparatus 20 are controlled so that the open-loop phase shift of negative feedback loop 810 will become 180° for stable actuation of negative feedback loop 810. Consequently, there are cases in which the phase of the output signals of signal sources 951, 952, 953, and 954 also changes when the frequency changes. It is ideal that in this case, the frequency and phase of the output signals of signal sources 951, 952, 953, and 954 are updated simultaneously. When the frequency and phase of the output signals cannot be controlled so that they change simultaneously, signal sources 951, 952, 953, and 954 are controlled so that at least the frequency of the output signals changes simultaneously. Negative feedback loop 810 oscillates when the frequency of the signals supplied to quadrature detector 910 and the frequency of the signals supplied to vector modulator 940 differ. Oscillation of negative feedback loop 810 will prolong the convergence time of the output signals of current-to-voltage converter 800. Consequently, inhibiting such oscillation of negative feedback loop 810 is important for high-speed measurement and, as described above, signal sources 951, 952, 953, and 954 are controlled so that the frequency of their output signals will change simultaneously. Here, the oscillation of negative feedback loop 810 means that the output signals of filter 920 or filter 930 oscillate. Therefore, if negative feedback loop 810 is stabilized, the output signals of filter 920 or filter 930 will also be stabilized. Negative feedback loop 810 will be in an unstable state when any of signal sources 951, 952, 953, or 954 output unexpected signals from the time computer 1000 has controlled the signals until they are changed to the expected frequency. If negative feedback loop 810 is in an unstable state, the convergence time of the output signals of current-to-voltage converter 800 will be prolonged. In order to prevent negative feedback loop 810 from becoming unstable, during the time when unexpected signals are output, the signals that are fed to quadrature detector 910 and/or the signals that are fed to vector modulator 940 should at least be controlled so that the signals become zero or direct-current signals. There should be a signal source capable of outputting zero or direct-current signals or a switch for switching between the supplied signals and zero or direct-current signals in order to make the supplied signals into zero or direct-current signals, and this signal source or switch should be controlled as needed by computer 1000.

Furthermore, only signal sources 951 and 952 of impedance measuring apparatus 20 are controlled in order to adjust the open-loop phase shift of negative feedback loop 810. Of course, signal sources 953 and 954 of impedance measuring apparatus 20 are controlled so that the output signals of signal source 953 and the output signals of signal source 954 are orthogonal with one another. However, the open-loop phase shift of negative feedback loop 810 is adjusted by controlling signal sources 951 and 952. As a result, it is not necessary to finely tune the phase of the output signals of signal sources 953 and 954 and signal sources with excellent noise characteristics and distortion characteristics can be selected. The results of measurements by vector voltmeter 400 depend on the characteristics of the output of signal sources 953 and 954, and therefore, selecting signal sources that have excellent noise characteristics and distortion characteristics as signal sources 953 and 954 puts the impedance measuring apparatus at an advantage. On the other hand, signal sources with a high phase-adjustment precision can be selected for signal sources 951 and 952 as long as the noise contained in the output signals and the distortion component of the output signals are eliminated by the following filters 920 and 930.

Figure 5:
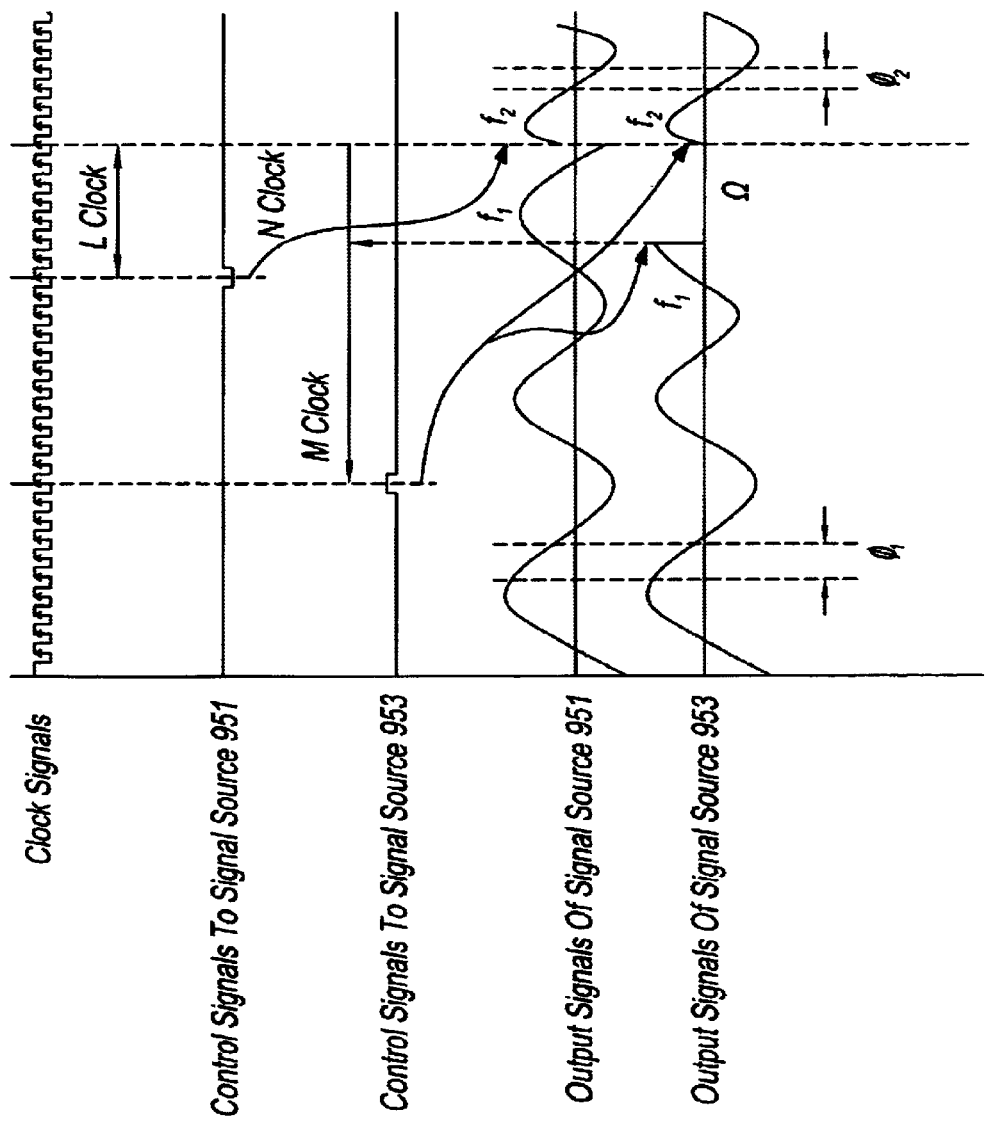
FIG. 5 is a drawing showing the output signals of signal sources 951 and 953.

The output signals of signal sources 951 and 953 that follow the above-mentioned rules for control are illustrated in FIG. 5. By means of this example, the frequency of the output signals of signal sources 951 and 953 is changed from $f_1$ to $f_2$ and the phase difference between the two signals is changed from $\phi_1$ to $\phi_2$. Signal sources 951 and 953 are different signal sources. Signal sources 951 and 953 operate in response to the same clock signals. Signal source 951 is the signal source that is capable of fine-tuning the phase of the output signals. Moreover, signal source 951 is the signal source with which the frequency and phase of the output signals changes once a pre-determined wait time (L clock) after the signal source 951 have been controlled by computer 1000 has passed. Signal source 953 is the signal source with better noise characteristics and distortion characteristics of the output signals than signal source 951. In addition, for convenience of internal processing, signal source 953 outputs zero or direct-current signals between the time when the signal source 953 are controlled by computer 1000 and when the output signals are updated to the expected frequency and phase. In the figure, the output signals become zero (0) M clock after signal source 953 has been controlled by computer 1000, and then they are updated to the expected frequency $f_2$ after N clock. As a result, the frequency of the output signals of signal sources 951 and 953 is updated to the expected value $f_2$ and the phase difference between the two signals also is updated to the expected value $\phi_2$. The control signals in the figure are signals that actually reflect the frequencies and phase that have been pre-set for each signal source. In such a case, signal sources 951 and 953 of impedance measuring apparatus 20 should be controlled so that the frequencies of the output signals of signal sources 951 and 953 simultaneously change. The same is true for signal sources 952 and 954. As in the previous example, signal sources 951, 952, 953, and 954 of impedance measuring apparatus 20 are easily actuated in synchronization with one another as long as the pre-determined wait time when the signals of signal sources 951, 952, 953, and 954 change is determined by the period of the clock signals. This fact does not change, even if signal sources 951, 952, 953, and 954 are not the same.

The narrow-band amplifier of the present invention solves the problem of convergence time attributed to the phase-shift circuit and the phase-tracking circuit by comprising four signal sources that are controlled as needed and thereby curtails the convergence time of the output signals and reduces the error in the one-loop phase of the negative feedback loop. As a result, high-speed, high-precision amplification is possible. The impedance measuring apparatus of the present invention with this type of narrow-band amplifier is capable of high-speed, high-precision measurement. Moreover, it is not necessary that the narrow-band amplifier or the impedance measuring apparatus of the present invention comprises a phase-shift circuit or a phase-tracking circuit and therefore, its structure can be simplified and the measurement error attributed to the temperature characteristics of the phase-shift circuit and the phase-tracking circuit can be alleviated. The narrow-band amplifier and the impedance measuring apparatus of the present invention do not require an analog circuit, such as a phase-shift circuit, and therefore, a high level of integration is possible. The multiplied effect of a high level of integration and a simplified structure results in a much smaller circuit. In addition, by means of the narrow-band amplifier and the impedance measuring apparatus of the present invention, the open-loop phase shift of the negative feedback loop is adjusted by controlling the signal sources that supply signals to the quadrature detector, and therefore, the degree of freedom in selecting the signal source is expanded and an excellent signal source can be used. In addition, conventional phase-shift circuits or phase-tracking circuits comprise analog components and therefore, depending on the amount of phase change, the level of signals that are fed to the quadrature detector or vector modulator changes. On the other hand, the output signal level of the numerically controlled oscillator of the narrow-band amplifier of the present invention does not change, even if the phase of the output signals is adjusted. An impedance measuring apparatus comprising this type of narrow-band amplifier is capable of measuring a broad range of impedance values.

What is claimed is:

1. A narrow-band amplifier comprising a quadrature detector, integrators, and a vector modulator, said narrow-band amplifier resolving input signals into in-phase components and quadrature-phase components by means of said quadrature detector, integrating said in-phase components and said quadrature-phase components by means of said respective integrators, vector-modulating said integrated in-phase components and said integrated quadrature-phase components by means of said vector modulator, and outputting the vector signals;

a first signal source which feeds a first sine-wave signal to said quadrature detector, a second signal source which feeds a first cosine-wave signal orthogonal with the first sine-wave signals to said quadrature detector, a third signal source which feeds a second sine-wave signal to said vector modulator, a fourth signal source which feeds a second cosine-wave signal orthogonal with the second sine-wave signals to said vector modulator, said first, second, third, and fourth signal sources are signal sources that numerically control the output signal frequency and phase by a controller, with the output signals being updated once their respective pre-determined wait times have passed after control by said controller, and said controller controls said first, second, third and fourth signal sources before the time when they are about to be synchronized by said pre-determined wait times so that the times when the output signals of said first, second, third, and fourth signal sources are updated are all synchronized.

2. The narrow-band amplifier according to claim 1, wherein the signals that are fed to said quadrature detector and said vector modulator are controlled so that a state in which the output signals of said integrators are stable is maintained.

3. The narrow-band amplifier according to claim 1, wherein the phase difference between said first sine-wave signals and said second sine-wave signals is adjusted by controlling said first signal source, and the phase difference between said first cosine signals and said second cosine signals is adjusted by controlling said second signal source.

4. The narrow-band amplifier according to claim 1, further comprising:

a clock source, wherein said clock source feeds clock signals to the first, second, third, and fourth signal sources, and wherein said pre-determined wait time is determined by the period of said clock signals.

5. An impedance measuring apparatus which comprises:

a signal source connected to the first terminal of a device under test;

a feedback amplifier that is connected to the second terminal of said device under test to keep said second terminal at virtual ground and converts current signals that flow to said device under test to voltage signals and outputs said voltage signals, said feedback amplifier comprising a narrow-band amplifier;

means for determining the vector voltage ratio of the voltage signals between said first and second terminals and the output signals of said feedback amplifier, and that measures the impedance of said device under test from said vector voltage ratio, wherein said narrow-band amplifier comprising a quadrature detector, integrators, and a vector modulator and resolving input signals into in-phase components and quadrature-phase components by means of said quadrature detector, integrating said in-phase components and said quadrature-phase components by means of said respective integrators, vector-modulating said integrated in-phase components and said integrated quadrature-phase components by means of said vector modulator, and outputting the vector signals;

a first signal source which feeds a first sine-wave signal to said quadrature detector;

a second signal source which feeds a first cosine-wave signal orthogonal with the first sine-wave signals to said quadrature detector, a third signal source which feeds a second sine-wave signal to said vector modulator, a fourth signal source which feeds a second cosine-wave signal orthogonal with the second sine-wave signals to said vector modulator, wherein said first, second, third, and fourth signal sources are signal sources that numerically control the output signal frequency and phase by means of a control means, with the output signals being updated once their respective pre-determined wait time has lapsed after control by said control means; and said control means which controls said first, second, third and fourth signal sources before the time when they are about to be synchronized by said pre-determined wait time so that the times when the output signals of said first, second, third, and fourth signal sources are updated are all synchronized.

6. The impedance measuring apparatus according to claim 5, wherein the signals that are fed to said quadrature detector and said vector modulator are controlled so that a state in which the output signals of said integrators are stable is maintained.

7. The impedance measuring apparatus according to claim 5, wherein the phase difference between said first sine-wave signals and said second sine-wave signals is adjusted by controlling said first signal source, and the phase difference between said first cosine signals and said second cosine signals is adjusted by controlling said second signal source.

8. The impedance measuring apparatus according to claim 5, further comprising:

a clock source which feeds clock signals to the first, second, third, and fourth signal sources, and wherein said pre-determined wait time is determined by the period of said clock signals.

9. An impedance measuring apparatus comprising:

a signal source connected to a first terminal of a device under test;

a feedback amplifier that is connected to the second terminal of said device under test to keep said second terminal at virtual ground and that converts current signals that flow to said device under test to voltage signals and outputs these voltage signals, said feedback amplifier comprising a modulation-type narrow-band amplifier comprising a quadrature detector and a vector modulator;

means for determining the vector voltage ratio of the voltage signals between said first and second terminals and the output signals of said feedback amplifier, and that measures the impedance of said device under test from said vector voltage ratio;

a first signal source which feeds a first sine-wave signal to said quadrature detector;

a second signal source which feeds first cosine-wave signal orthogonal with the first sine-wave signals to said quadrature detector;

a third signal source which feeds a second sine-wave signal to said vector modulator, a fourth signal source which feeds a second cosine-wave signal orthogonal with the second sine-wave signal to said vector modulator, said first, second, third, and fourth signal sources are signal sources whose output signal frequency and phase are numerically controlled by means of said control means, and said control means adjusts the phase difference between said first sine-wave signals and said second sine-wave signals by controlling said first signal source and adjusts the phase difference between said first cosine-wave signals and said second cosine-wave signals by controlling said first signal source.

* * * * *